United States Patent
Atnip

Patent Number: 6,030,754
Date of Patent: Feb. 29, 2000

[54] PHOTORESIST REMOVAL WITHOUT ORGANIC SOLVENT FOLLOWING ASHING OPERATION

[75] Inventor: Earl V. Atnip, Plano, Tex.

[73] Assignee: Texas Instruments Incorporated, Dallas, Tex.

[21] Appl. No.: 08/985,593

[22] Filed: Dec. 5, 1997

Related U.S. Application Data

[60] Provisional application No. 60/032,614, Dec. 5, 1996.

[51] Int. Cl.[7] .................................................... G03F 7/00
[52] U.S. Cl. ........................... 430/329; 134/1.2; 134/1.3; 438/906
[58] Field of Search .............................. 430/329; 134/1.2, 134/1.3; 438/906

[56] References Cited

U.S. PATENT DOCUMENTS

| | | | |
|---|---|---|---|
| 5,007,981 | 4/1991 | Kawasaki | 134/1.2 |
| 5,759,751 | 6/1998 | Shimizu | 430/329 |
| 5,849,639 | 12/1998 | Molloy | 438/906 |

Primary Examiner—Sharon Gibson
Assistant Examiner—Nicole Barreca
Attorney, Agent, or Firm—Robert D. Marshall, Jr.; Gerald E. Laws; Richardson L. Donaldson

[57] ABSTRACT

A method of removing photoresist material from a semiconductor wafer is disclosed. The method includes rinsing the semiconductor wafer in an organic solvent selected to dissolve the photoresist material. The method next rinses the semiconductor wafer in a light alcohol such as isopropyl alcohol. The method next subjects the semiconductor wafer to an alcohol vapor dry operation. An oxygen plasma ashing operation is then used to oxidize organic material on the semiconductor wafer. This is followed by another rinse. This post ash rinse includes only the light alcohol without the organic solvent. The post ash rinse may include dipping the semiconductor wafers into one or two isopropyl alcohol tanks. Finally is another alcohol vapor dry operation. The elimination of organic solvent use during the post ash rinse operation following the oxygen plasma ashing: reduces the organic solvent costs of acquisition, handling and disposal; reduces the length of time needed for the post ash rinse; reduces the capital equipment costs for the post ash rinse; and it is believed eliminates yield loss due to contaminants in the organic solvent.

5 Claims, 3 Drawing Sheets

PHOTORESIST REMOVAL WITHOUT ORGANIC SOLVENT FOLLOWING ASHING OPERATION

This application claims priority under 35 USC 119(e) (1) of provisional application number 60/032,614, filed Dec. 05, 1996.

TECHNICAL FIELD OF THE INVENTION

The technical field of this invention is processing of semiconductor wafers following etching for via formation.

BACKGROUND OF THE INVENTION

Current integrated circuits such as employed in dynamic random access memories (DRAM) employ multiple layers of metal for interconnection. This requires vertical connections between metal layers. These vertical connections are called vias. These vias are formed in the semiconductor wafers before the wafers are cut into individual integrated circuits.

Vias are formed in etched holes above a prior metal line. The holes are etched using a patterned photoresist layer. A photoresist layer is deposited on the entire surface of the semiconductor wafer. The photoresist layer is selectively exposed to light everywhere a via is to be etched. The light exposed portions of the photoresist layer are developed and then removed leaving a hole over each location where a via is to be formed. The hole serves to enable selective etching of an oxide layer. In order to form a good via all the oxide covering the metal line must be etched away. This process leaves the metal lines exposed where the vias are to be formed.

The next task is the removal of the remaining photoresist layer. In the prior art this is a multistep process that typically employs organic solvent that attacks the photoresist material. Such organic solvents are used when metal lines are exposed. Other processes not related to this invention are used when metal lines are not exposed. The typical organic solvents used are harmful to personnel and hazardous to the environment. Due to the expense of the organic solvent for acquisition, handling and disposal, elimination of any operation using such organic solvents would be advantageous.

SUMMARY OF THE INVENTION

This invention is a method of removing photoresist material from a semiconductor wafer. A typical semiconductor manufacturing operation includes etching via holes for metal interconnects masked by patterned photoresist material. The method includes rinsing the semiconductor wafer in an organic solvent. This organic solvent is selected to dissolve the photoresist material. The typical organic solvent employed is known in the industry as ACT CMI manufactured by Ashland Chemical Co. of Columbus, Ohio. The method next rinses the semiconductor wafer in isopropyl alcohol. The method next subjects the semiconductor wafer to isopropyl alcohol vapor dry operation. An oxygen plasma ashing operation is then used to oxidize organic material on the semiconductor wafer. This is followed by another rinse. This post ash rinse includes only isopropyl alcohol without the organic solvent. The post ash rinse may include dipping the semiconductor wafers into one or two isopropyl alcohol tanks. Finally is another isopropyl alcohol vapor dry operation.

The elimination of organic solvent use during the post ash rinse operation following the oxygen plasma ashing has many advantages. The amount of organic solvent used is reduced, thereby reducing acquisition, handling and disposal costs. The length of time needed for the post ash rinse is reduced, thereby reducing work in progress inventory costs. The capital equipment needed for the post ash rinse is lower in cost. It is believed that contaminants in the organic solvent reduces yield when used in the post ash rinse, thus its elimination should increase integrated circuit yield.

BRIEF DESCRIPTION OF THE DRAWINGS

These and other aspects of this invention are illustrated in the drawings, in which.

DETAILED DESCRIPTION OF PREFERRED EMBODIMENTS

The method of this invention is most applicable to photoresist removal when metal lines are exposed. Via formation is a time when this occurs. However, there would be exposed metal following patterned metal deposition and fuse etching. Photoresist layers are used for many patterning operations in semiconductor wafer fabrication. When there will be no exposed metal lines, it is typical to employ inorganic acids or bases to remove the photoresist. Such inorganic acids or bases are generally less expensive and less difficult to use than the processes described in this application. However, these inorganic acids or bases are not used when there are exposed metal lines. This is because the inorganic acids or bases typically used would attack the metal lines. This could result in inoperative integrated circuits due to damaged metal lines. Thus it is typical to employ organic solvents for photoresist removal when metal lines are exposed.

FIGS. 1a to 1f illustrate part of a semiconductor wafer at various stages of processing for via formation. Current integrated circuits such as employed in dynamic random access memories (DRAM) employ multiple layers of metal for interconnection. This requires vertical connections between metal layers. These vertical connections are called vias. These vias are formed in the semiconductor wafers before the wafers are cut into individual integrated circuits. This application will use via formation as an example of the type of operation that requires photoresist removal when metal lines are exposed. However, this invention can be advantageously practiced for photoresist removal whenever metal lines are exposed.

Figure 1A:
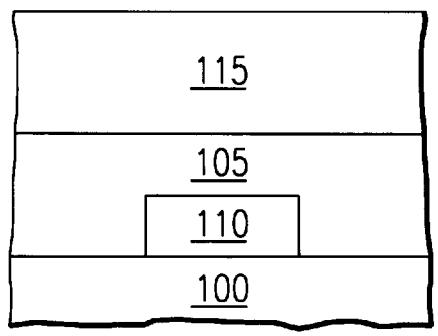
FIGS. 1a to 1f illustrate part of a semiconductor wafer near a location where a via is to be located in various stages of processing.

FIG. 1a illustrates semiconductor substrate 100 having a metal line 110. Semiconductor substrate 100 may be intrinsic semiconductor or may have either P-type or N-type impurities. The type of semiconductor is not relevant to this invention. Metal line 110 is surrounded by an oxide layer 105. According to the prior art the upper surface of oxide layer 115 is polished to be smooth and flat.

Figure 1B:
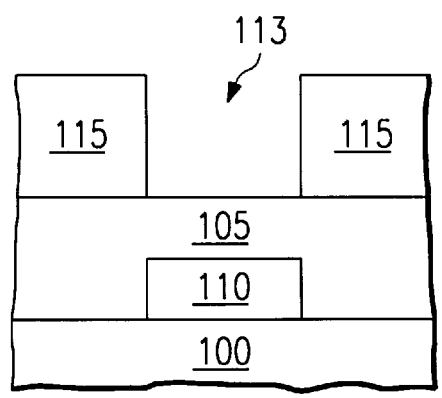

The first step in via formation is deposition of a photoresist layer 115. Photoresist layer 115 covers the entire surface of the semiconductor wafer. The photoresist layer 115 is typically about 17,000 angstroms. As known in the art, photoresist layer 115 is selectively exposed to light everywhere a via is to be etched. In a typical semiconductor wafer there would be several hundred thousand to millions of via per semiconductor wafer. The light exposed portions of the photoresist layer 115 are developed and then removed leaving a hole 113 as illustrated in FIG. 1b. Note that one hole 113 is provided over each location where a via is to be formed.

Figure 1C:
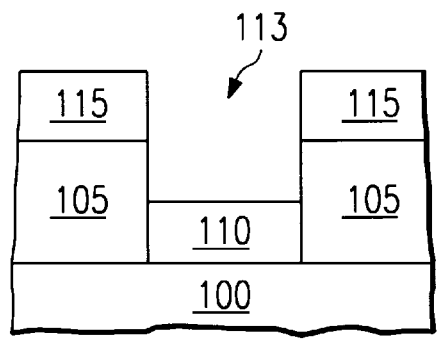

The hole 113 serves to enable selective etching of oxide layer 105. A dry etch process etches the oxide at the bottom of hole 113. To form a good via all the oxide covering metal line 110 must be etched away. It is typical to slightly over etch to insure complete etching over the entire wafer. This may result in some removal of metal line 110 at some portions of the semiconductor wafer. The amount of over etch is not critical because oxide layer 105 typically etches away at a rate of about twenty times the rate of etching of metal lines 110. This etching process also removes portions of photoresist layer 115. In the typical case with of an original depth of 17,000 angstroms about 4000 to 7000 angstroms of photoresist layer 115 remain after etching. FIG. 1c illustrates the result of the etching step. Note hole 113 has been etched down to exposed metal line 110 and much of photoresist layer 115 has been etched.

Figure 2:
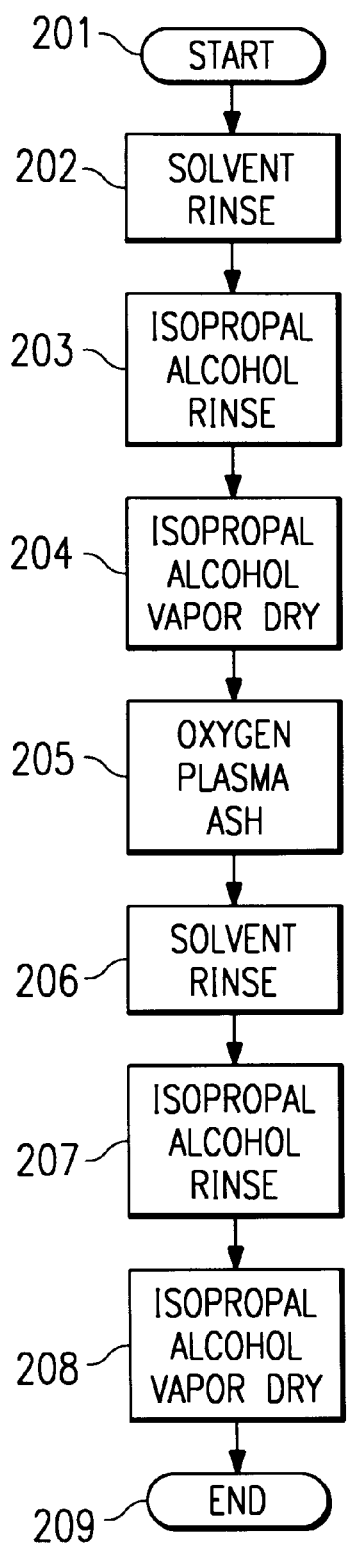
FIG. 2 illustrates a flow chart of semiconductor processing for photoresist removal according to the prior art.

The next task is the removal of the remaining photoresist layer 115. FIG. 2 illustrates the steps employed for photoresist removal in the prior art. The process is begun in start block 201. First is an organic solvent rinse (block 202). The semiconductor wafer is dipped in an organic solvent tank. The organic solvent is selected specifically to dissolve the particular photoresist material used. The organic solvent typically used is known in the industry as ACT CMI manufactured by Ashland Chemical Co. of Columbus, Ohio. ACT CMI is a solvent stripper. This organic solvent has a number of components that attack the photoresist. The organic solvent rinse is followed by an alcohol rinse (block 203). Any light alcohol may be used in this process, such as ethyl alcohol, methyl alcohol or isopropyl alcohol. Due to the relative costs of these alcohols, it is typical in the industry to use isopropyl alcohol. All following references to this alcohol will refer to isopropyl alcohol. It should be understood that any other light alcohol, such as ethyl alcohol or methyl alcohol, could be used. The organic solvent is miscible in the isopropyl alcohol. The purpose of the isopropyl alcohol rinse is removal of the organic solvent from the semiconductor wafers. There are components within the organic solvents typically used that absorb water from the air to form compounds that attack the metal lines. Thus it is important to completely remove the organic solvents. Following the isopropyl alcohol rinse is an isopropyl alcohol vapor dry (block 204).

Figure 3:
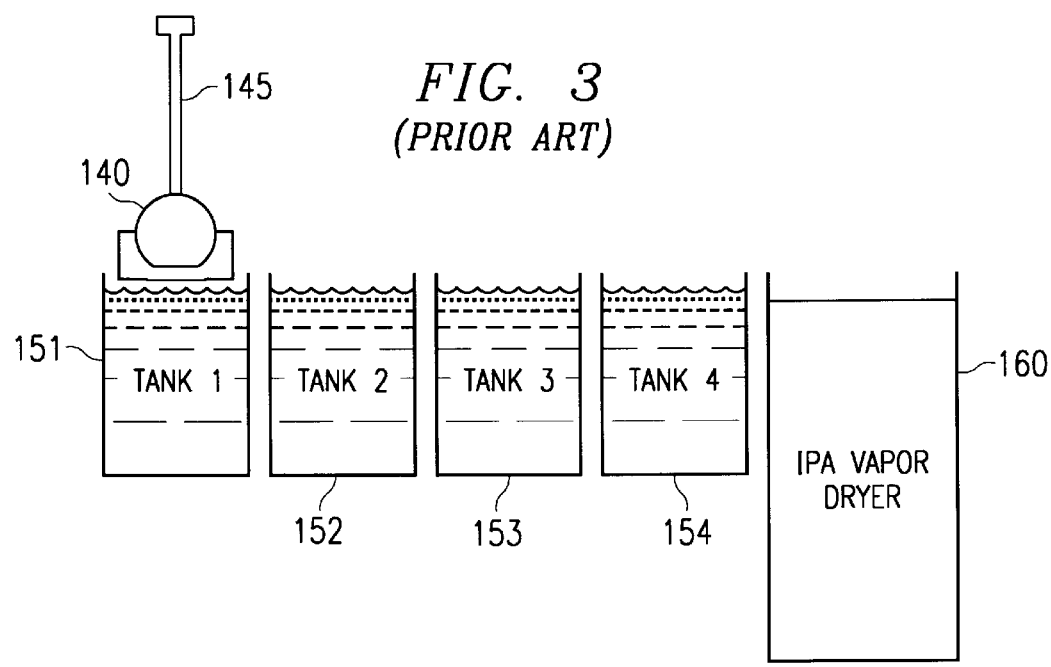
FIG. 3 illustrates an example of the apparatus used for the organic solvent rinse, isopropyl alcohol rinse and isopropyl alcohol vapor dry in the prior art.

The steps of blocks 202 to 204 are typically performed in an apparatus such as illustrated in FIG. 3. FIG. 3 illustrates semiconductor wafer 140 held by wafer holder 145. Semiconductor wafer 140 is dipped into four successive tanks 151, 152, 153 and 154. Typically tanks 151 and tanks 152 hold the the solvent stripper ACT CMI. Tank 153 may hold either the solvent stripper ACT CMI or isopropyl alcohol. Tank 154 holds isopropyl alcohol. The semiconductor wafer 140 is typically dipped into the organic solvent tanks 151, 152 and optionally 153 for about 9 minutes. The semiconductor wafer 140 is typically dipped into the isopropyl alcohol tank 154 and optionally 153 for about 9 minutes.

Figure 4:
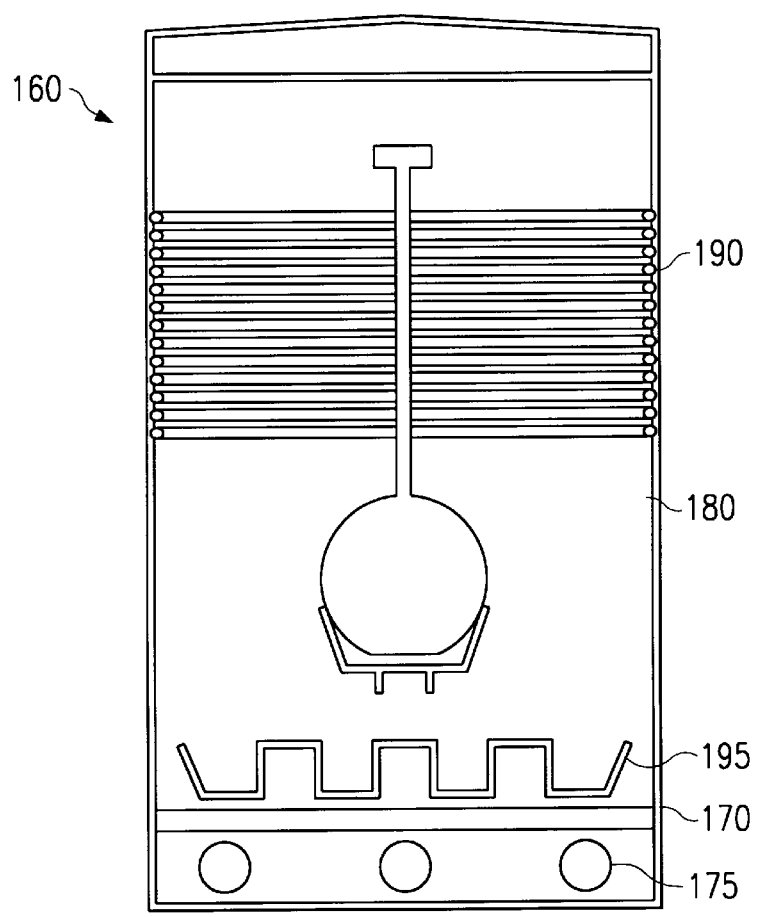
FIG. 4 illustrates an example of the apparatus used for the isopropyl alcohol vapor dry illustrated in FIG. 3 in the prior art.

Lastly, semiconductor wafer 140 is lowered into isopropyl alcohol vapor dryer 160. This is illustrated more clearly in FIG. 4. A pool of isopropyl alcohol 170 is heated by heating rods 175. This forms an isopropyl alcohol vapor cloud 180 that surrounds semiconductor wafer 140. The top of the apparatus includes condensation coils 190 to condense isopropyl alcohol vapor. The condensed liquid isopropyl alcohol is captured in drip pan 195. The vapor cloud 180 surrounds semiconductor wafer 140. Proper control of the heating by heating rods 175 and the cooling by condensation coils 190 results in a relatively stable isopropyl alcohol vapor cloud 180. Isopropyl alcohol vapor condenses on the entire surface of semiconductor wafer 140. The condensation mixes with and carries off organic solvent remaining on semiconductor wafer 140.

Figure 1D:
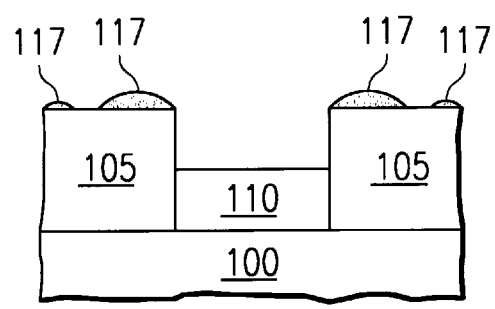

Once the semiconductor wafers are removed from isopropyl alcohol vapor dryer 160 any remaining isopropyl alcohol will evaporate. FIG. 1d illustrates the portion of the semiconductor wafer following the isopropyl alcohol vapor dry operation. Note that the organic solvent rinse has removed most but not all of the photoresist layer 115. However, small amounts of photoresist 117 remain.

Figure 1E:
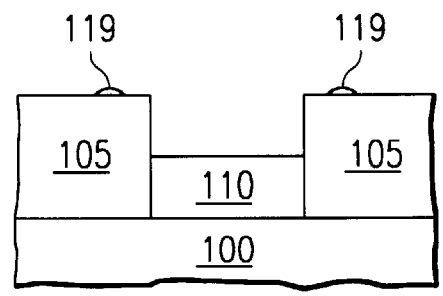
Figure 1F:
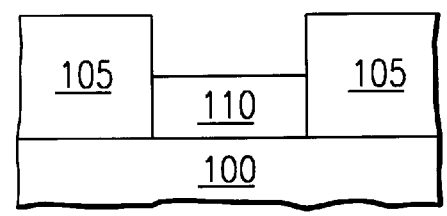

The next step is an oxygen plasma ash operation (block 205). This operation serves to oxidize any remaining organic materials. Note that other oxidization operations may be substituted for oxygen plasma ashing. As shown in FIG. 1e, the result is a few oxide particles 119 formed from the remaining photoresist 117. This oxygen plasma ash operation is known as a relatively dirty operation. This means that this operation typically leaves many fine particles deposited on the semiconductor wafer.

The next task is to remove the remnants of the photoresist 115. According to the prior art, this involves another organic solvent rinse (block 206) in the same manner as the organic solvent rinse in block 202. This is followed by an isopropyl alcohol rinse (block 207) in the same manner as the isopropyl alcohol rinse of block 203. It is typical for these post ash rinses to use from 6 to 7 minutes in each tank 151, 152, 153 and 154. Finally, the semiconductor wafers are subjected to an isopropyl alcohol vapor dry (block 208) in the same manner as isopropyl alcohol vapor dry of block 204. These steps are typically performed in an apparatus as illustrated in FIG. 3. The photoresist removal is now complete (end block 209).

The removal of the photoresist according to this invention is similar to the process of the prior art. In this invention the rinse following the oxygen plasma ashing operation employs only isopropyl alcohol and no organic solvent is used. This process is based upon the assumption that all or most of the usefulness of the organic solvent occurs during the initial rinse. Thus it is believed that little additional photoresist is removed by the organic solvent following the oxygen plasma ashing operation. If this is true, then organic solvent use during the rinse following the oxygen plasma ashing operation is unnecessary and can be eliminated. This assumption is contrary to the belief in the art that using the organic solvent during the post ash rinse is useful and necessary.

Figure 5:
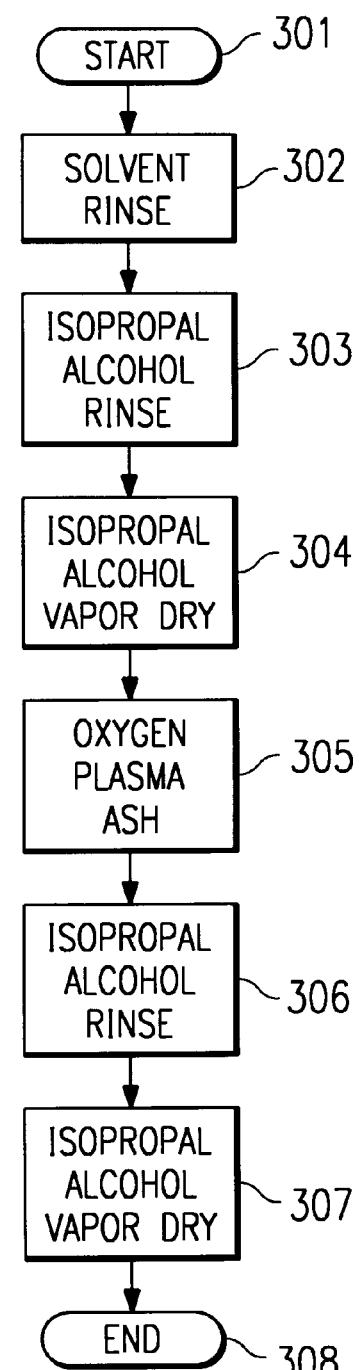
FIG. 5 illustrates a flow chart of semiconductor processing for photoresist removal according to this invention.

FIG. 5 illustrates the steps for photoresist removal according to this invention. The process is begun in start block 301. First is an organic solvent rinse (block 302) similar to organic solvent rinse of block 202. The organic solvent rinse is followed by an isopropyl alcohol rinse (block 303) similar to isopropyl alcohol rinse of block 203. Following the isopropyl alcohol rinse is an isopropyl alcohol vapor dry (block 304) similar to the isopropyl alcohol vapor dry of block 204. These steps are typically performed in an apparatus such as illustrated in FIG. 3. Once the semiconductor wafers are removed from isopropyl alcohol vapor dryer 160 any remaining isopropyl alcohol will evaporate. The next step is an oxygen plasma ash operation (block 305) similar to the oxygen plasma ash operation of block 205. This is followed by an isopropyl alcohol rinse (block 306) in the same manner as the isopropyl alcohol rinse of block 207. Note that an organic solvent rinse similar to organic solvent rinse of block 206 is not performed according to this invention. Finally, the semiconductor wafers are subjected to an isopropyl alcohol vapor dry (block 307) in the same manner as isopropyl alcohol vapor dry of block 208. These latter two steps can be performed in an apparatus such as illustrated in FIG. 3 with the elimination of tanks 151 and 152 or the elimination of tanks 151, 152 and 153. The photoresist removal is now complete (end block 308).

The elimination of the organic solvent rinse of block 206 has many beneficial effects. First, there is no need to buy, store and dispose of the organic solvent that would have been used in the post ash organic solvent rinse of block 206. The typical organic solvents, such as solvent stripper ACT-CMI, are difficult to handle. These organic solvents are typically hydrophilic, taking up water vapor from the surrounding air. Thus these organic solvents cannot be used in open tanks for long periods. These organic solvents must be replaced when they become saturated with dissolved material. The organic solvents are typically replaced at intervals of about 4 to 6 hours and never at intervals of more than 24 hours. Thus these organic solvents used in relatively large quantities. These organic solvents are absorbed thorough the skin so personnel must be protected from contact. Because the organic solvents could serve as a carrier of all manner of contaminants into the body, it is especially important to protect personnel from skin contact. Lastly, these organic solvents must be disposed when used. This disposal is complicated by the fact that the organic solvents typically used in these processes are considered hazardous waste.

There are additional benefits from elimination of the post ash organic solvent rinse step. There is a reduction in processing time because two or three organic solvent rinses are eliminated. This results in more efficient equipment usage and a reduction the number of semiconductor wafers work in process. These factors tend to reduce the cost of integrated circuit manufacture. Substitution of a post ash isopropyl alcohol only rinse for the prior art organic solvent and isopropyl alcohol rinses reduces the number of required tanks by two or three. This reduction in required equipment can be significant. A single machine as illustrated in FIG. 3 for a combined organic solvent rinse and isopropyl alcohol rinse may cost about $1,000,000. The substitution of a post ash isopropyl alcohol only rinse requires a machine costing only $200,000 to $300,000. This reduction in the capital expense for processing the same number of semiconductor wafers increases the economic efficiency of manufacture.

A final benefit is realized from elimination of the post ash organic solvent rinse step. It is believed that the contaminant levels within the new organic solvents received from the vendors is many times higher than the contaminant levels of new isopropyl alcohol. It is believed that the post ash organic solvent rinse may deposit some of these contaminants on the semiconductor wafers. This contaminant deposition may result in some unusable integrated circuits from that semiconductor wafer. Consequently, it is believed that elimination of the post ash organic solvent rinse step will reduce this contaminant deposition and increase the number of good integrated circuits per wafer. This advantageously reduces the manufacturing cost per good integrated circuit.

Two experiments were conducted to test this new processing technique. In the first experiment a lot of semiconductor wafers were split with odd numbered wafers and even numbered wafers. The odd numbered wafers were processed according to the invention as shown in FIG. 5. That is following the ashing operation for Via 2 etch clean up, these wafers were rinsed in isopropyl alcohol only. The even numbered wafers processed according to the prior art as illustrated in FIG. 2. Thus these wafers received both an organic solvent rinse and an isopropyl alcohol rinse following the ashing step. These odd and even numbered wafers were then combined for standard processing through a parametric testing operation. At parametric testing the via characteristics of the odd and even numbered wafers were separately measured. Table 1 illustrates the mean via resistance, their variance and standard deviation.

TABLE 1

| Experiment 1 Via 2 | Mean Via Resistance (OHM) | Variance in Via Resistance | Standard Deviation in Via Resistance |
|---|---|---|---|
| Standard | 2.91 | 1.141 | 1.068 |
| Experimental | 2.46 | 0.089 | 0.299 |

Table 1 shows that the mean via resistance for the experimental wafers is slightly lower than that for the standard wafers. This lower resistance is not believed statistically significant, that is, it does not necessarily indicate a decreased via resistance. Since the vias are in the conductive path on the integrated circuits formed from the semiconductor wafers, any decreased resistance is advantageous. A statistically significant reduction in the variance of the via resistance was measured. The lower variance of the experimental wafers indicates more consistent processing across the wafers and across the experimental odd numbered wafers. This consistency in processing is advantageous.

The second experiment divided a lot of 24 semiconductor wafers into three groups. Wafers 1 to 8 were processed according to this invention with an isopropyl alcohol only rinse following the ashing operation. Wafers 9 to 16 were processed according to the prior art except that an ultrasonic input to the organic solvent tanks was turned off during the organic solvent rinse steps. Wafers 17 to 24 were processed according to the prior art. Following the via etch clean up operations, the three groups were combined for the remainder of processing. All the wafers were subject to parametric tests and multiprobe yield tests. Due to unrelated issues 8 wafers were scrapped after the parametric tests. Thus the multiprobe yield data listed below covers only the 16 wafers numbered 1, 2, 7, 8, 9, 10, 12, 14, 15, 16, 18, 19, 21, 22, 23 and 24. Table 2 lists the mean via resistance, the variance and the standard deviation of this mean via resistance for via 1.

TABLE 2

| Experiment 2 Via 2 | Mean Via Resistance (OHM) | Variance in Via Resistance | Standard Deviation in Via Resistance |
|---|---|---|---|
| Standard | 0.639 | 0.0010 | 0.03 |
| Experimental | 0.669 | 0.0009 | 0.03 |

Table 2 shows a slight difference in via resistance that is not statistically significant between the experimental and standard processing. Table 2 shows a statistically significant reduction in the variance in the via resistance for the experimental wafers over the standard wafers.

Table 3 lists the mean via resistance, the variance and the standard deviation of this mean via resistance for via 2.

TABLE 3

| Experiment 2 Via 2 | Mean Via Resistance (OHM) | Variance in Via Resistance | Standard Deviation in Via Resistance |
|---|---|---|---|
| Standard | 0.568 | 0.00028 | 0.017 |
| Experimental | 0.576 | 0.00008 | 0.009 |

Table 3 shows a slight difference in via resistance that is not statistically significant between the experimental and standard processing. Table 3 shows a statistically significant reduction in the variance in the via resistance for the experimental wafers over the standard wafers.

Table 4 lists the multiprobe yields of the standard and experimental wafers. Recall that Table 4 lists data for only 16 of the original 24 wafers.

TABLE 4

| Experiment 1 Multiprobe Yield | Mean % |
|---|---|
| Standard | 63.71% |
| Experimental | 69.00% |

Table 4 shows an increase in multiprobe yield of the experimental wafers over the standard wafers. This difference is not statistically significant. Thus this difference suggests there may by a yield increase employing the experimental processing but does not indicate this difference. The 5.3% yield improvement suggested by this data would represent a large cost savings over the standard processing if is real. Thus the processing of this invention is improved over the standard processing.

What is claimed is:

1. A method of removing photoresist material from a semiconductor wafer comprising the steps of:

rinsing the semiconductor wafer in an organic solvent, said organic solvent selected to dissolve the photoresist material;

rinsing the semiconductor wafer in a light alcohol miscible with said organic solvent, said light alcohol selected from the group consisting of ethyl alcohol, methyl alcohol and isopropyl alcohol;

subjecting the semiconductor wafer to vapor drying in said light alcohol;

oxidizing organic material on the semiconductor wafer;

rinsing the semiconductor wafer in only said light alcohol without said organic solvent; and subjecting the semiconductor wafer to vapor drying in said light alcohol.

2. The method of claim 1, wherein:

said step of rinsing the semiconductor wafer in only said light alcohol without said organic solvent consists of dipping the semiconductor wafer in a tank containing said light alcohol and not containing the organic solvent.

3. The method of claim 1, wherein:

said step of rinsing the semiconductor wafer in only said light alcohol without said organic solvent consists of dipping the semiconductor wafer in a first tank containing said light alcohol and not containing the organic solvent, and thereafter dipping the semiconductor wafer in a second tank containing said light alcohol and not containing the organic solvent.

4. The method of claim 1, wherein:

said step of oxidizing organic material on the semiconductor wafer consists of subjecting the semiconductor wafer to an oxygen plasma ashing operation.

5. The method of claim 1, wherein:

said semiconductor wafer has exposed metal lines;

said organic solvent is further selected not to attack said exposed metal lines; and further comprising not exposing said semiconductor wafer to agents that attack said exposed metal lines.

* * * * *